United States Patent [19]
Chen et al.

[11] Patent Number: 5,777,502
[45] Date of Patent: Jul. 7, 1998

[54] METHOD TO PROTECT GATE-SOURCE ELEMENTS OF EXTERNAL POWER FETS FROM LARGE PRE-DRIVE CAPACITY

[75] Inventors: Wayne T. Chen, Plano; Steven C. Jones, Garland; Stephen C. Kwan, Plano, all of Tex.

[73] Assignee: Texas Instruments Incorporated, Dallas, Tex.

[21] Appl. No.: 693,765

[22] Filed: Aug. 7, 1996

[51] Int. Cl.⁶ .......................... H03K 5/08; H03K 17/687
[52] U.S. Cl. .......................... 327/309; 327/328; 327/381; 327/427
[58] Field of Search .......................... 327/309, 318, 327/320–324, 327, 328, 331, 332, 427, 434, 437, 375, 381; 361/91, 98

[56] References Cited

U.S. PATENT DOCUMENTS

| | | | |
|---|---|---|---|
| 4,890,009 | 12/1989 | Miyazaki et al. | 327/579 |
| 5,369,308 | 11/1994 | Schoofs et al. | 327/427 |
| 5,387,830 | 2/1995 | Kukimoto | 327/322 |
| 5,422,593 | 6/1995 | Fujihira | 327/427 |

*Primary Examiner*—Timothy P. Callahan
*Assistant Examiner*—T. T. Lam
*Attorney, Agent, or Firm*—W. James Brady, III; Richard L. Donaldson

[57] ABSTRACT

A circuit (10) and method for protecting the gate-source elements of an FET includes a circuit (12, 13) for providing a pullup gate drive current to the gate-source elements. A voltage sensing circuit (45) senses a voltage on the gate-source elements to produce an indication if the voltage has exceeded a predetermined level. The voltage sensing circuit (45) has a zener diode (48) and a current mirror with first (52) and second (51) current flow paths. The zener diode (48) and the first flow path (52) are connected between the gate and a source of the FET. When a voltage between the gate and source of the FET exceeds the breakdown voltage of the zener diode (48) and one $V_{gs}$ in the current mirror, a current flows in the first flow path (52) producing a current flow in the second flow path (51). A circuit (20, 23, 62, 58, 60) reduces the pullup gate drive current in response to the current in the second flow path (51).

20 Claims, 1 Drawing Sheet

METHOD TO PROTECT GATE-SOURCE ELEMENTS OF EXTERNAL POWER FETS FROM LARGE PRE-DRIVE CAPACITY

BACKGROUND OF THE INVENTION

1. Field of the Invention

This invention relates to improvements in electronic circuits and electronic circuit techniques, and more particularly to improvements in power driver circuits, and still more particularly to improvements and methods for voltage limiting to protect the gate-source elements of FET devices.

2. Relevant Background

Large field effect transistors (FETs) are often used for power switching in automotive and in a myriad of other applications. Typically, for example, the FETs are switched in a sequence to supply or apply drive currents, for instance, to coils of a motor, which may control a power window, mirror, or other function. Generally, an integrated circuit is provided that generates the driving and switching signals to the FETs; however, because of the size of the FETs, and the magnitude of the currents and voltages that often exist require special protecting components. In most power FETs, it is necessary to protect the gate-source elements from high voltages, usually larger than 20 volts. Usually such components are located externally from the integrated circuit that generates the drive signals.

In the past, one way by which such high voltage protection has been accomplished was through the use of clamping diodes, connected externally from the integrated circuit. This added unwanted cost to the overall system. Another way by which high voltage protection was accomplished was through the use of diode clamps built into the integrated circuit chip itself. However in the case of very large power FETs, which require large amounts of gate charge to be rapidly supplied, which involves large drive currents, it was not viable to construct the required large clamping diodes directly onto the integrated circuit chip in order to enable the large currents and power to be handled.

SUMMARY OF THE INVENTION

In light of the above, therefore, it is an object of the invention to provide an improved method and circuit for monitoring the gate-source voltage applied to the gate of an FET, and for reducing the gate drive current when a predetermined gate-source voltage has been exceeded.

It is another object of the invention to provide an improved method and circuit of the type described that enables the use of smaller clamping diodes, and which has reduced power dissipation and circuit area.

One advantage of the invention is that clamping diodes can be kept small, even with large gate drive outputs.

Another advantage of the invention is that a small current is allowed to be supplied to the gate of external power FETs to reduce the effects of leakages.

Still another advantage of the invention is that the gate source voltage is tracked, as opposed to using a ground reference.

These and other objects, features and advantages of the invention will be apparent to those skilled in the art from the following detailed description of the invention, when read in conjunction with the accompanying drawings and appended claims.

According to a broad aspect of the invention, a circuit is provided for protecting the gate-source elements of an FET from over voltage. The circuit includes a circuit for providing a pullup gate drive current to the gate-source elements and a voltage clamp connected across the gate-source elements. The voltage clamp has a predetermined allowable maximum current withstanding level. A circuit is provided to sense a voltage across the gate-source elements to produce an indication when the voltage has exceeded a predetermined level. A circuit is also provided for reducing the pullup gate drive current when the circuit to sense a voltage produces an indication that the voltage has exceeded the predetermined level.

The circuit to sense a voltage on the gate-source elements of the FET to produce an indication when the voltage has exceeded a predetermined level has an element to establish a voltage threshold, such as a zener diode, and a current mirror having first and second current mirror flow paths. The threshold establishing element and the first current mirror flow path are connected between the gate and the source of the FET. When a voltage between the gate and source of the FET exceeds the breakdown voltage of the zener diode and a control voltage of a control transistor in the current mirror (for example, one $V_{gs}$), a current flows in the first current mirror flow path producing a current flow in the second current mirror flow path. The circuit for reducing the pullup gate drive current when the circuit to sense a voltage produces an indication that the voltage has exceeded the predetermined level has first and second pullup current flow paths and a circuit for summing a current flowing in each of the first and second pullup current flow paths to control the pullup voltage. Additionally, a circuit is provided for switching off a current flow in the second pullup current flow path when a current flows in the first current mirror flow path.

The circuit may also include a current sink connected to sink current from the current mirror and a logic circuit connected between the current sink and a switch in the circuit for switching off a current flow in the second pullup current flow path. The current sink is biased so that the current sink normally holds an input to the logic circuit low, but when a current flows in the first current mirror flow path, the current sink cannot continue to sink current at a rate that holds the input to the logic circuit low, thereby causing the switch in the circuit for switching off a current flow to switch off.

According to another broad aspect of the invention, a circuit is presented for protecting a gate-source elements of an FET from over voltage. The circuit includes a first current mirror circuit for providing a pullup gate drive current to the gate-source elements of the FET and a second current mirror circuit to sense a voltage on the gate-source elements of the FET to produce an indication when the voltage has exceeded a predetermined level. A circuit reduces the pullup gate drive current when the second current mirror circuit produces an indication that the voltage has exceeded the predetermined level.

The circuit for reducing the pullup gate drive current has first and second current flow paths. A circuit sums a current flowing in each of the first and second current flow paths to provide the pullup drive current, and a circuit turns off the current in the first current flow path when the second current mirror circuit produces an indication that the voltage has exceeded the predetermined level.

According to yet another broad aspect of the invention, a method for protecting a gate-source elements of an FET is presented. The method includes providing a pullup gate drive current to the gate-source elements of the FET. The gate-source voltage of the FET is clamped to a predetermined allowable maximum current withstanding level. The voltage on the gate-source elements of the FET is sensed and an indication that the voltage has exceeded a predetermined level is produced. When the indication is produces that the voltage has exceeded the predetermined level, the pullup gate drive current is reduced.

BRIEF DESCRIPTION OF THE DRAWING

The invention is illustrated in the accompanying drawing, in which.

DETAILED DESCRIPTION OF THE PREFERRED EMBODIMENTS

Figure 1:
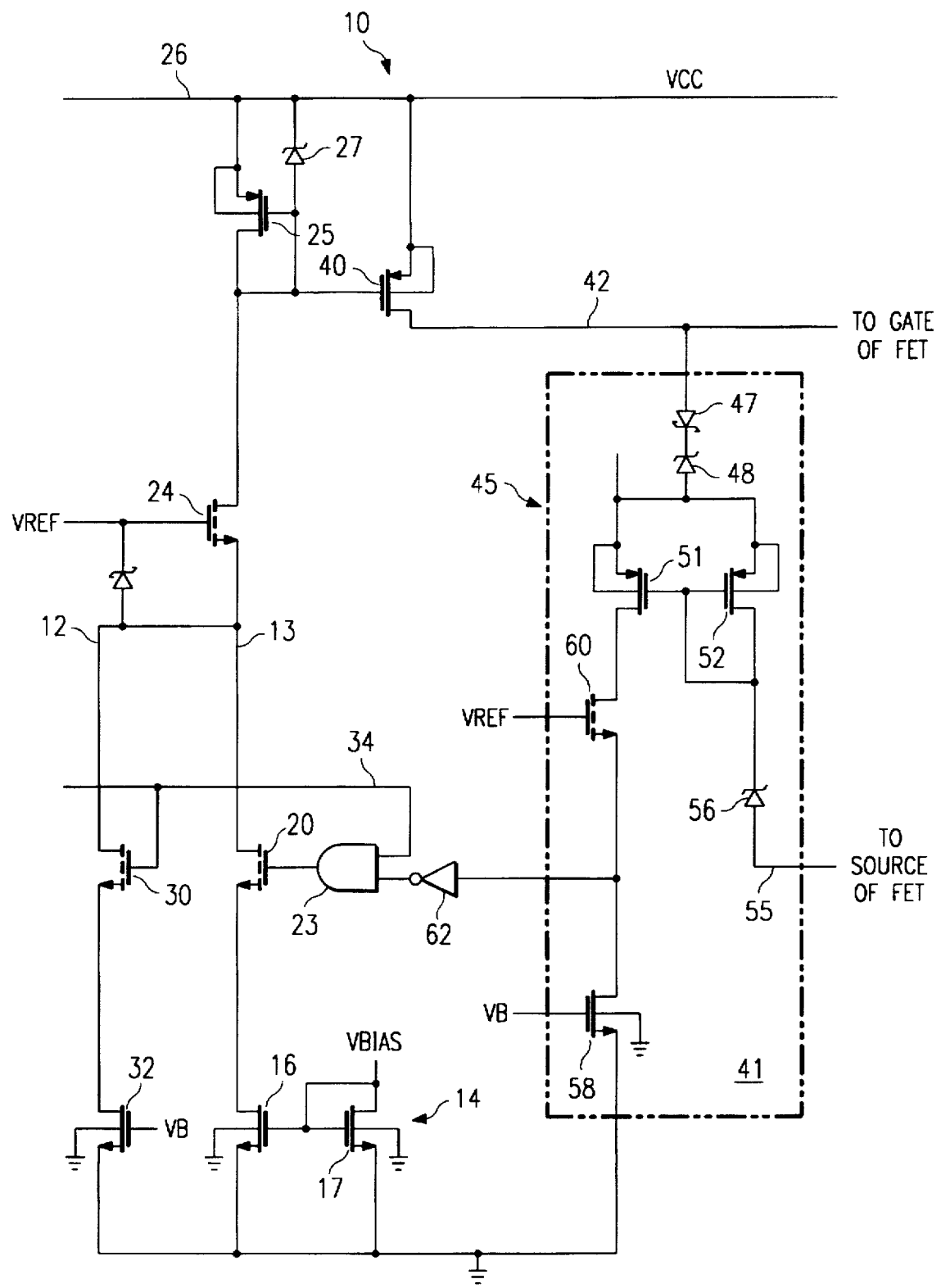
FIG. 1 is an electrical schematic diagram of a circuit, in accordance with a preferred embodiment of the invention for protecting the gate source elements of an external power FETS from large voltages.

According to a preferred embodiment of the invention, a voltage is sensed across the gate-source elements of the power FET, and upon detection of voltages higher than desired, the pullup gate drive current is reduced to a small amount that the clamps can withstand.

A schematic of an embodiment 10 of a high-side pre-drive circuit for H-bridge application is shown in FIG. 1. The circuit 10 has two reference current flow paths 12 and 13. The flow path 13 has a first current mirror 14, which includes a pair of n-channel metal oxide semiconductor (NMOS) transistors 16 and 17. (The transistors used in the circuit may be, for example, 5 volt devices.) A third NMOS transistor 20, which is connected as a switch, is connected in the flow path 13 in series with the NMOS transistor 16, with its gate connected to receive the output of an AND gate 23. The NMOS transistor 16 serves to sink current in the current flow path 13, as controlled by the mirror NMOS transistor 17. The NMOS transistor 16 is biased by a bias voltage, $V_{BIAS}$ and the NMOS transistor 32 is biased by a biasing voltage, VB, such that the current through the current flow path 12 is much less than the current through the current flow path 13.

A p-channel metal oxide semiconductor (PMOS) transistor 25 is connected from the $V_{cc}$ rail 26 in series with the NMOS switch transistor 20 and mirror transistor 16 of the current flow path 13 to source current to the two current flow paths 12 and 13. A zener diode 27 is connected between the $V_{cc}$ supply rail 26 and the gate of the PMOS transistor 25 to protect the gate-source elements of the PMOS transistor 25 from excessive gate to source voltage under extreme bias conditions. In addition, an NMOS cascode load transistor 24 is connected in series between the current source transistor 25 and the two current flow paths 12 and 13 to offer increased protection at the drain-source elements of the NMOS switches 30 and 20.

The other current flow path 12 includes a second NMOS switch transistor 30 connected in series between the source of the NMOS transistor 24 and a current sink, provided by an NMOS transistor 32. A circuit enable line 34 is connected to the gate of the switching transistor 30 and one of the inputs of the AND gate 23. The enable line 34 may be connected to an enable signal (not shown) to activate or deactivate the circuit 10, as desired. Alternatively, as will become apparent, the switches 20 and 30 may be connected in a manner whereby the switch 30 is turned on and switch 20 is turned off when the voltage threshold of the detection circuit has been exceeded.

A second PMOS current source transistor 40 is connected between the $V_{cc}$ supply rail 26 and the gate of a power FET transistor (not shown) on line 42. The gate of the PMOS transistor 40 is connected to the gate of the PMOS transistor 25; consequently, the combination of the PMOS transistors 40 and 25 form a current mirror in which the current that flows in the PMOS current sourcing transistor 25 is mirrored by the current that flows in the PMOS current sourcing transistor 40.

The voltage across the gate-source elements of the external FET device is sensed by a maximum voltage detection circuit 41. The maximum voltage detection circuit 41 includes another current mirror 45 connected to the drain of the PMOS current source transistor 40 by back-to-back diodes 47 and 48, diode 47 being a Schottky diode, and diode 48 being a zener diode. (The zener diode 47 serves as a voltage protection element, and may be omitted in some applications.) The current mirror 45 has two PMOS transistors 51 and 52. The PMOS transistor 52 is connected between the anode of the zener diode 48 and line 55 which is referenced to the source of the power FET. The other PMOS transistor 51 is connected between a supply voltage and an NMOS current sinking transistor 58. The gate of the NMOS transistor 58 is connected to a bias voltage VB (which need not necessarily be the same as the bias voltage described above on the gate of the NMOS transistor 32). The NMOS transistor 58 may in some applications be replaced by a resistor. An NMOS voltage referencing cascode load transistor 60 is connected in series between the PMOS mirror transistor 51 and NMOS current sinking transistor 58. Finally, an inverter 62 (which may be alternatively, for example, a Schmitt trigger) is connected between the drain of the NMOS current sinking transistor 58 and a second input to the AND gate 23. The NMOS current sinking transistor 58 sinks current so that the input to the inverter 62 is ordinarily low, causing the lower input to the AND gate 23 to be normally high. The combination of high states on the input elements to the AND gate 23 causes the NMOS transistor 20 be ordinarily switched on.

In normal operation, state changes are normally applied to the gate of the power FET on the control line 42 by a control circuit (not shown). At the same time, the NMOS transistors 32, 16, and 17 form the current sources that will determine the strength of the pullup PMOS transistor 40. The pullup PMOS transistor 40 actually provides a current source, as mentioned, connected by the PMOS current mirror transistor 25.

Thus, when NMOS switch transistors 20 and 30 are on, the currents sunk by NMOS transistors 32 and 16 are summed by the PMOS current source transistor 25, and mirrored to PMOS transistor 40, with some gain, if desired, depending upon the particular sizing of the PMOS mirror transistors 25 and 40.

A clamp detection circuit that detects an over voltage on the FET gate drive line 42 includes the diodes 47, 48, and 56, the PMOS transistors 51 and 52, the NMOS transistor 60, and the NMOS transistor 58. When the voltage on the gate drive line 42 exceeds the breakdown voltages of the two zener diodes 48 and 56 plus the forward voltage of the Schottky diode 47, plus the $V_{gs}$ of the PMOS transistor 52, then current will be conducted through the PMOS transistor 51. The current through PMOS transistor 51 overwhelms the current being sunk through the NMOS transistor 58, providing more current to the NMOS transistor 58 than it is able to immediately sink. The voltage on the input to the inverter 62, therefore rises, causing the output of the inverter 62 to fall. This disables the NMOS switch transistor 20 through the AND gate 23. However, since the drive to the gate of the power FET is still commanded on, the NMOS transistor switch 30 is still on and conducts a small current through the NMOS current sink transistor 32. Thus, in the event of an over voltage appearing on the line 42 to the gate of the power FET (and therefore appearing between the gate and source of the power FET), the pullup voltage on the gate of the PMOS transistor 40 is reduced to the level provided by the NMOS transistor 32 alone, thereby reducing the voltage clamping requirements on the power FET. Concurrently, the PMOS transistor 51 continues to conduct, lowering the voltage seen on the drive signal line 42.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A circuit for protecting gate-source elements of an FET comprising:

a circuit for providing a pullup gate drive current to the gate-source elements of said FET;

a voltage clamp connected to a circuit to sense a voltage on said gate-source elements of said FET, said voltage clamp having a predetermined allowable maximum current withstanding level;

said circuit to sense a voltage on the gate-source elements of the FET producing an indication when said voltage on said rate-source elements has exceeded a predetermined level;

and a circuit for reducing the pullup gate drive current when the circuit to sense a voltage produces said indication that the voltage on said gate-source elements has exceeded the predetermined level.

2. The circuit of claim 1 wherein said circuit to sense a voltage on the gate-source elements of the FET comprises a zener diode and a current mirror having first and second current flow paths, said zener diode and said first current flow path being connected between the gate-source elements of said FET, whereby when said voltage between the gate and source of said FET exceeds said predetermined level, a current flows in said first current flow path, producing a current flow in said second current flow path.

3. The circuit of claim 2 wherein said current mirror comprises PMOS transistors.

4. The circuit of claim 2 wherein said predetermined level is a breakdown voltage of the zener diode and a control voltage of a control transistor in said current mirror.

5. The circuit of claim 1 wherein said circuit for reducing the pullup gate drive current comprises first and second current flow paths, and a circuit for summing a current flowing in each of said first and second current flow paths to control the pullup gate drive current.

6. The circuit of claim 5 wherein said first and second current flow paths comprises NMOS transistors.

7. The circuit of claim 5 wherein said circuit to sense a voltage on the gate-source elements of the FET comprises a zener diode and a current mirror having first and second current mirror flow paths, said zener diode and said first current mirror flow path being connected between a gate and a source of said FET, whereby when said voltage between the gate and source of said FET exceeds a breakdown voltage of the zener diode and a control voltage of a control transistor in said current mirror, a current flows in said first current mirror flow path to produce a current flow in said second current mirror flow path; and wherein said circuit for reducing the pullup gate drive current further comprises a circuit for switching off a current flow in said first current flow path when a current flows in said first current mirror flow path.

8. The circuit of claim 7 further comprising a current sink connected to sink current from said current mirror and a logic circuit connected between said current sink and a switch in said circuit for switching off a current flow in said first current flow path, said current sink being biased whereby said current sink normally holds an input to said logic circuit low, but when a current flows in said first current mirror flow path, said current sink cannot continue to sink current at a rate that holds the input to said logic circuit low, thereby causing said switch in said circuit for switching off a current flow to switch off.

9. A circuit for protecting gate-source elements of an FET from over voltage, comprising:

a first current mirror circuit for providing a pullup gate drive current to the gate-source elements of said FET;

a second current mirror circuit to sense a voltage on the gate-source elements of the FET to produce an indication when said voltage on the gate-source elements has exceeded a predetermined level;

and a circuit for reducing the pullup gate drive current when the second current mirror circuit produces said indication that the voltage on the gate-source elements has exceeded the predetermined level.

10. The circuit of claim 9 wherein said circuit for reducing the pullup gate drive current comprises:

first and second current flow paths;

a circuit for summing a current flowing in each of said first and second current flow paths to provide the pullup drive current;

and a circuit for turning off the current in said first current flow path when said second current mirror circuit produces said indication that said voltage on the gate-source elements has exceeded the predetermined level.

11. The circuit of claim 9 wherein said first current mirror circuit comprises PMOS transistors.

12. The circuit of claim 11 wherein said first current mirror circuit further comprises a zener diode connected between a gate and source of one of said PMOS transistors.

13. The circuit of claim 9 wherein said second current mirror circuit comprises PMOS transistors.

14. The circuit of claim 10 in which said circuit for turning off the current in said first current flow path comprises a switch in said first current path, and a circuit for turning off said switch when said second current mirror circuit produces said indication that said voltage on said gate-source elements has exceeded the predetermnined level.

15. The circuit of claim 14 wherein said circuit for turning off said switch comprises a current sink connected to apply a first state to said switch to normally turn said switch on, and to receive current from said second mirror circuit at a rate faster than said current sink can dissipate to provide a second state to turn said switch off.

16. The circuit of claim 15 further comprising a logic circuit having an output connected to control said switch according to the states provided by said current sink.

17. A method for protecting gate-source elements of an FET comprising:

providing a pullup gate drive current to the gate-source elements of said FET;

clamping said gate-source elements of said FET to a predetermined allowable maximum current withstanding level;

sensing a voltage on the gate-source elements of the FET to produce an indication when said voltage on the gate-source elements has exceeded a predetermined level;

and reducing the pullup gate drive current when the voltage on said gate-source elements has exceeded the predetermined level.

18. The method of claim 17 wherein said step of sensing a voltage on the gate-source elements of the FET comprises providing a current mirror having first and second current flow paths, whereby when said voltage between the gate and source of said FET exceeds said predetermined level, a current flows in said first current flow path.

19. The method of claim 17 wherein said step of reducing the pullup gate drive current includes summing a current in first and second current flow paths to control the pullup gate and reducing the current in said first current flow path.

20. The method of claim 17 further comprising the steps of sinking a current with a current sink from said gate-source elements, and sourcing a current to said current sink from a current source when said voltage of said gate-source elements exceeds said predetermined level, and controlling the pullup gate drive current by the current source.

* * * * *